(12) United States Patent
Christ

(10) Patent No.: US 7,705,759 B2
(45) Date of Patent: Apr. 27, 2010

(54) GENERATION OF A DIGITAL CONTROLLED PRECISE ANALOG SINE FUNCTION

(75) Inventor: Volker Christ, Neuss (DE)

(73) Assignee: Infineon Technologies AG, Neubiberg (DE)

(*) Notice: Subject to any disclaimer, the term of this patent is extended or adjusted under 35 U.S.C. 154(b) by 258 days.

(21) Appl. No.: 11/831,868

(22) Filed: Jul. 31, 2007

(65) Prior Publication Data

US 2009/0033379 A1 Feb. 5, 2009

(51) Int. Cl.
*H03M 1/66* (2006.01)
(52) U.S. Cl. ..................... 341/147; 341/144
(58) Field of Classification Search ............. 341/147, 341/144; 338/195, 308
See application file for complete search history.

(56) References Cited

U.S. PATENT DOCUMENTS 4,097,988 A * 7/1978 Hauschild ............... 29/620

OTHER PUBLICATIONS

Katsuta et al., :Planar Trapezoid Dipole Antenna Having Notch at 5GHZ and Multi Band for 2GHz WLAN and UWB, IEEE, 2007, pp. 641-644.*

* cited by examiner

*Primary Examiner*—Jean B Jeanglaude
(74) *Attorney, Agent, or Firm*—SpryIP, LLC

(57) ABSTRACT

Disclosed are techniques for generating a precisely controlled analog signal. In one described implementation, a semiconductor circuit is mounted on a circuit board having a power and a ground etching. The circuit has a power terminal coupled with the power etching and a ground terminal coupled with the ground etching. The circuit includes a trapezoid shaped resistive strip coupled with the power terminal and the ground terminal. Contacts are connected along one edge of the strip to provide outputs at various voltage levels. Switches having a common output are coupled with the contacts on the strip. A control circuit activates the switches so that the common output generates an analog signal.

23 Claims, 4 Drawing Sheets

GENERATION OF A DIGITAL CONTROLLED PRECISE ANALOG SINE FUNCTION

BACKGROUND

For testing purposes and for analog processing of signals, it is desirable to generate an analog sine signal that can be regulated as to the signal's frequency and phase. One technique used to generate a sine signal is to store a sine function in a table in a memory. The table contains digital values that, when converted to an analog signal using a digital to analog converter (DAC), generate the analog sine signal. This technique may require a large number of transistors to construct the DAC and thus uses an unnecessarily large amount of semiconductor layout space. Further the resolution of the sine value is often portrayed inaccurately.

Rectangular shaped resistive strips connected to a switch with a common output have been used to generate sine waves. These rectangular shaped resistive strips have a voltage applied across opposing edges of the strip, and legs are placed at interval locations. Switches are connected to the legs and are selected to pass the voltage levels on the legs to a common output. This conventional rectangular-shaped strip undesirably consumes a relatively large amount of silicon in the semiconductor device. Further, the precise spacing of the legs needed to obtain an appropriate sine function is not always exact or sufficiently accurate and repeatable in production, resulting in strips that generate imprecise sine waves at the output.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Disclosed herein are techniques for generating a precisely controlled analog sine wave signal that may be used for internally testing components in a semiconductor device and/or may be used to drive other devices or circuits within the device. In one described implementation, a semiconductor circuit is mounted on a circuit board having a power and a ground etching. The circuit has a power terminal coupled with the power etching and a ground terminal coupled with the ground etching. The circuit includes a trapezoid shaped resistive strip coupled with the power terminal and the ground terminal. Contacts are connected along one edge of the strip to provide outputs at various voltage levels. Switches having a common output are coupled with the contacts on the strip. A control circuit activates the switches so that the common output generates an analog sine function. In this specification, although a sine wave is discussed for illustrative purposes, the disclosure also applies to cosine wave generation.

Also described herein is a method for coupling a trapezoid shaped resistive strip with a power terminal and a ground terminal. Contacts are attached along one edge of the strip to provide outputs at various voltage levels. Switches having a common output are coupled with the contacts on the strip and activated in predetermined order along the edge such that the common output generates a sine wave.

The techniques described herein may be implemented in a number of ways. One example environment and context is provided below with reference to the included figures and ongoing discussion.

Figure 1:
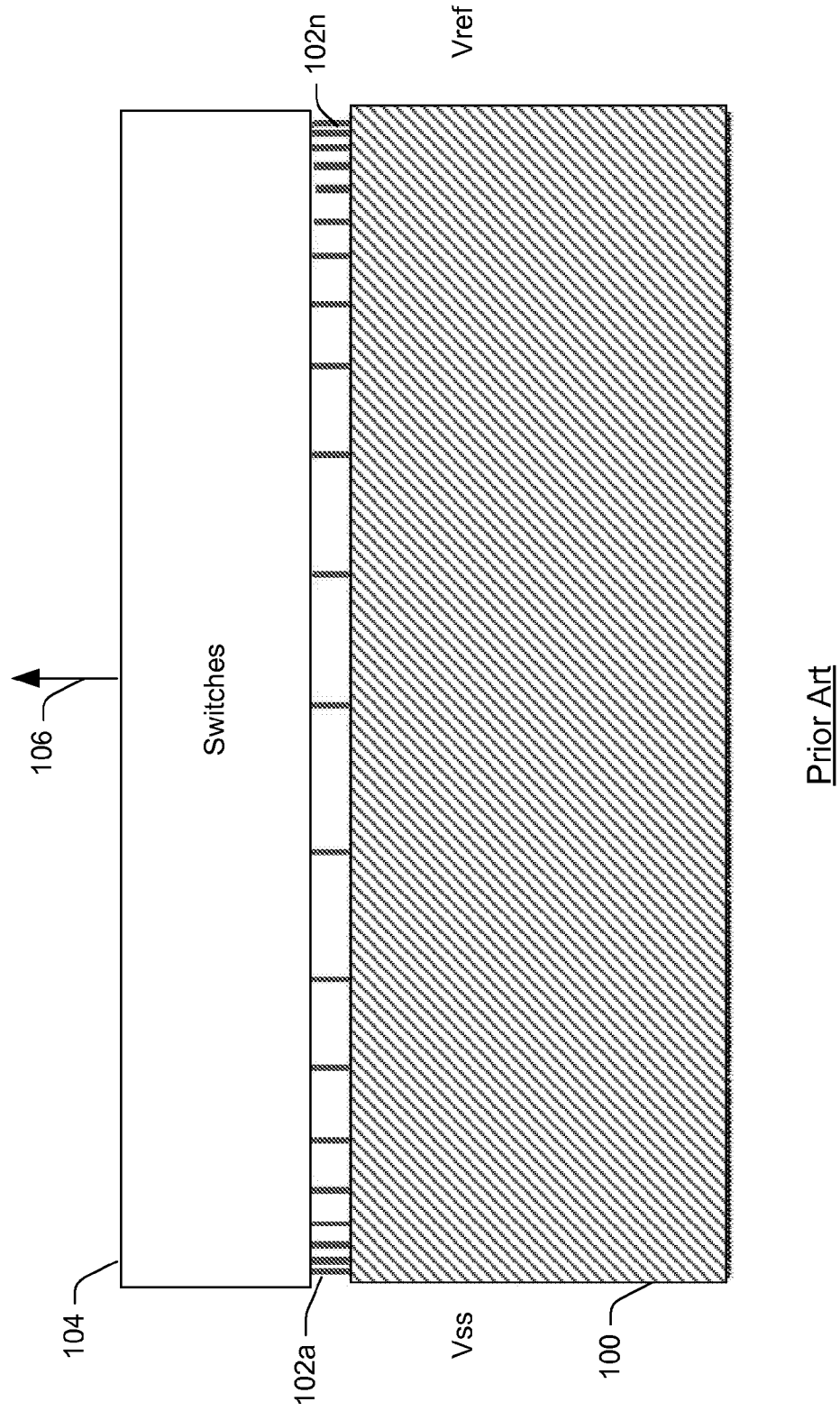
FIG. 1 is a prior art resistive strip for generating a controlled analog sine wave.

Illustrated in FIG. 1 is an exemplary prior art resistive strip 100 (also generally known as a resistive chain) that is placed in a semiconductor device in order to generate a sine or cosine wave. This strip 100 is rectangular shaped and formed of a resistive material, such as poly-silicon, although other resistive materials may be employed. Strip 100 has a power terminal edge for connection to a reference voltage Vref, a ground terminal edge for connection to a sink voltage Vss, and legs 102 ($a$-$n$) that are connected to switches 104. For simplicity of discussion, these conventional switches are not shown in detail. The resistive strip 100 is the equivalent of many two-resistor cascade coupled circuits that resist an electric current by producing a different voltage drop at each of legs 102($a$-$n$) in accordance with Ohm's law: The voltage drop at each leg is equal to the current through the resistor times the value of the resistance between the power terminal edge and each of legs 102($a$-$n$).

When voltages, such as a reference voltage (Vref) and a sink voltage, or ground, (Vss) are provided to parallel opposing edges (e.g., the power terminal edge and the ground terminal edge) of strip 100, voltages of decreasing levels ranging from Vref to Vss are generated at legs 102($a$-$n$), depending on which leg or legs are activated. Each of legs 102($a$-$n$) may be positioned on the long edge of strip 100 at intervals of A*cosine (90 z/n), where A is the length of the adjacent edge, z is the leg number, and n is the number of legs. Due to the positioning of the legs 102($a$-$n$), a sine wave is generated by activating switches 104 one at a time to pass various reference voltages on legs 102($a$-$n$) through to output 106.

Exemplary System

Figure 2:
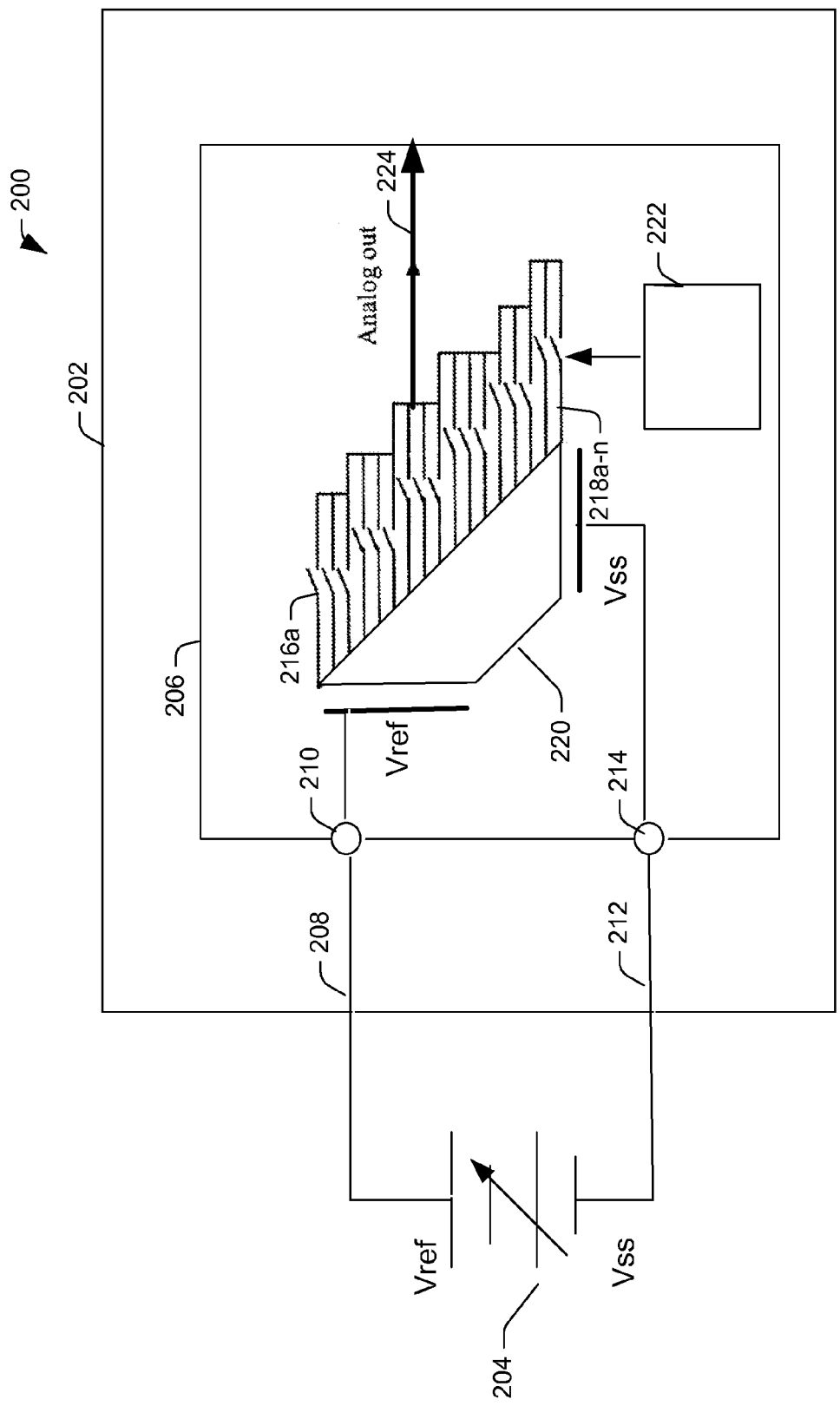
FIG. 2 is circuit diagram of a system for generating a sine wave.

FIG. 2 illustrates one implementation of a system 200 for generating an analog sine wave. The system 200 has a circuit board 202 or other substrate coupled to an adjustable power source 204 and a semiconductor device 206 mounted on or integrated into the circuit board 202. Circuit board 202 includes a power etching 208 for feeding a reference voltage (Vref) to terminal 210, and a ground etching 212 for feeding a ground reference voltage (Vss) to terminal 214.

Semiconductor device 206 includes switches 216($a$-$n$) that are connected to legs 218($a$-$n$) on a trapezoid shaped resistive strip 220 and are connected to switch control circuit 222. In one embodiment, switches 216($a$-$n$) may be constructed using transistors, which are connected to a common output 224. The transistors may be constructed of silicon, germanium, or other semiconductor material. Legs 218($a$-$n$) are positioned on the long edge of strip 220. One edge of strip 220 is connected to voltage Vref that is supplied via terminal 210, and another edge of strip 220 is connected to Voltage Vss that is supplied via terminal 214.

When voltages, such as reference voltage Vref and sink voltage or ground Vss, are provided to edges 226 and 228, respectively, voltages of decreasing levels ranging from Vref to Vss are generated on legs 218($a$-$n$) due to the resistive characteristics of strip 220 and ohms law. A sine wave is generated by control circuit 222 by activating switches 216 (a-n) to pass various reference voltages on legs 218(a-n) through to output 224. The switches 216(a-n) may, in one embodiment, be activated sequentially in the order that they are connected to legs 218(a-n). For example, switch 216n, which is connected to leg 218n, may be activated, followed by switch 216m, which is connected to leg 218m, and so forth. Thus, switches 216(n-a) may be sequentially activated until all the switches have be activated. In another embodiment, multiple switches may be selectively activated to simultaneously generate multiple sine waves.

According to one implementation, control circuit 222 includes a digital counter and an adjustable frequency generator (not shown). The frequency generator may be external to the semiconductor device 206, and may be provided via a test point on the device as is well known in the art. The frequency generated by the frequency generator may be adjusted to change the frequency of sine wave at output 224. Also, the voltage generated by power source 204 is adjustable to change the amplitude of the sine wave. The output analog sine wave on output 224 may be directly fed to an external pin on semiconductor device or may be provided internally to other circuits (not shown) in device 206.

Figure 3:
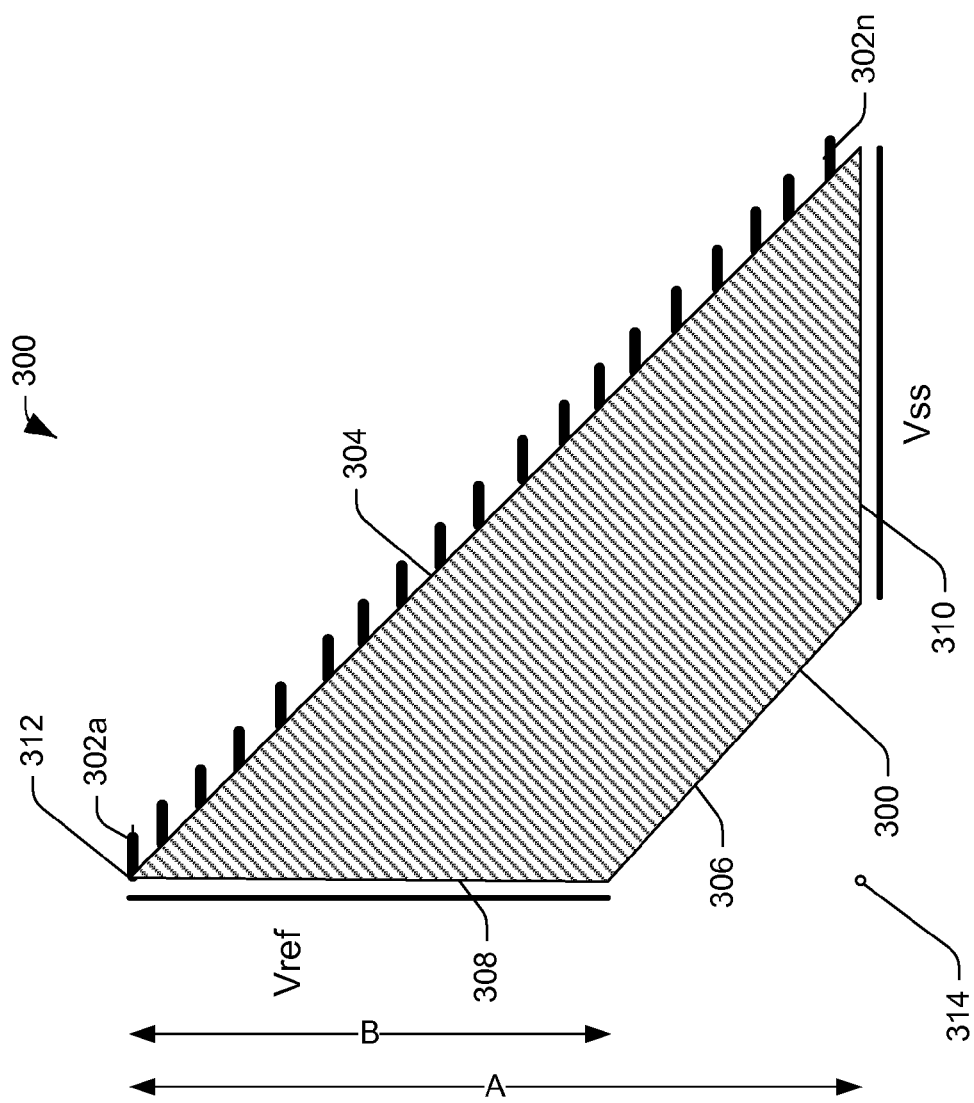
FIG. 3 is a schematic diagram of a trapezoid shaped resistive strip.

Illustrated in FIG. 3 is a trapezoid shaped resistive strip 300 (designated as strip 220 in FIG. 2) having legs 302(a-n). Trapezoid strip 300 has a long edge 304, a short edge 306, and two generally opposing edges 308 and 310, which may lie in the same plane and be of equal length. According to the implementation shown, edge 304 is positioned parallel to edge 306, and edge 308 is positioned at a right angle to edge 310, although other multi-sided, non-rectangular shapes may be employed. Point 312 is an intersection between the one of the equal length edges 308 and the long edge 304. Point 314 is an intersection point of imaginary lines extending through equal length edges 308 and 310. A length "A" is defined as a length of a line extending from point 312 to point 314 and may also be referred to herein as the height of the trapezoid strip 300. A length "B" is the length of edge 308 or edge 310. In one implementation, the ratio of length A to the length B is substantially the square root of pi (approximately 1.772).

Resistive strip 300 is constructed from a poly-silicon or other semiconductor material and implanted on a semiconductor material. In another implementation, Legs 302(a-n) are spaced at intervals of equal distance along the long edge 304. A voltage Vref is applied to edge 308 adjacent the long edge 304, and voltage Vss is applied to edge 310. In one embodiment, strip 300 contains evenly distributed holes (not shown) throughout the surface area of the strip to increase the overall resistance of strip 300.

Although the system 200 and resistive strip 300 are shown and described as a semiconductor device comprising a trapezoid shaped resistive strip connected with a set of switches, this implementation is meant to serve only as a non-limiting example.

Exemplary Process

Figure 4:
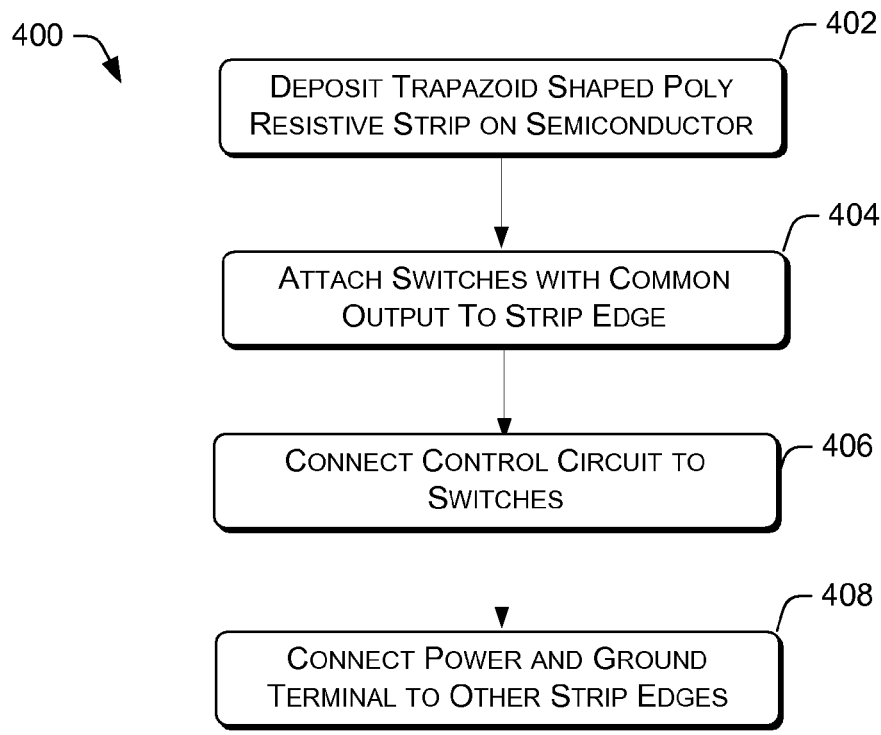
FIG. 4 is a flow diagram of a process for creating a system that generates a sine wave.
Figure 5:
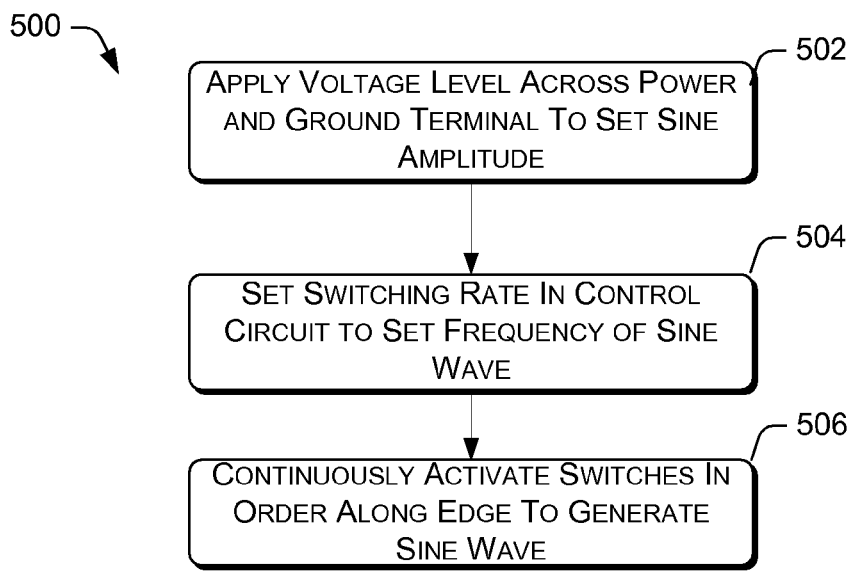
FIG. 5 is a flow diagram of a process for generating the sine wave using the system shown in FIG. 2.

FIGS. 4 and 5 show processes for making and using a system to generate an analog sine wave. Generally speaking, FIG. 4 shows one example implementation of a process 400 for building a system that is used to generate an analog sine wave. FIG. 5 shows one example implementation of a process 500 for generating an analog sine wave.

Specifics of exemplary methods are described below with reference to FIGS. 4 and 5. However, it should be understood that certain acts need not be performed in the order described, and may be modified, and/or may be omitted entirely, depending on the circumstances. Moreover, the acts described may be implemented by a computer, processor or other computing device based on instructions stored on one or more computer-readable media. The computer-readable media can be any available media that can be accessed by a computing device to implement the instructions stored thereon.

FIG. 4 shows a flowchart of a process 400 for building a system that is operable to generate an analog sine wave. The system shown in FIG. 2 and the trapezoid shaped resistive strip shown in FIG. 3 may be used for reference in describing the process 400.

At 402, resistive material, such as resistive poly-silicon, is deposited on the semiconductor device 206 in a trapezoid shaped resistive strip 300, as shown in FIG. 3. The resistive material may be formed with holes to increase the amount of resistance of the resistive strip 300.

At 404, switches 216(a-n) are attached to the legs 302(a-n) of the long edge 304 of resistive strip 300 and have a common output 224. For example, switches can be constructed with transistors formed in or on semiconductor device 206. The output of each of the transistors could be connected together to form a common output 224.

At 406, control circuit 222 is connected to each of the switches 218(a-n). In one implementation, control circuit 222 can be an up/down counter connected to a shift register. The counter counts up and then counts down to sequentially activate and deactivate each of the switches. The counter can be constructed with transistors formed on semiconductor device.

At 408, edge 308 is connected to power terminal 210 and edge 310 is connected to ground terminal 214 on semiconductor device 206 so that when a voltage is applied across terminals 210 and 214, that voltage is applied across edge 308 and edge 310.

FIG. 5 is a flow diagram of a process 500 of providing an analog sine wave. The system shown in FIG. 2 may be used for reference in describing process 500.

At 502, a voltage level is applied across power terminal 214 and ground terminal 210 which are then applied as voltage levels Vref and Vss respectively to the equal length edges (308 and 310) of strip 300. The shape and structure of trapezoid shaped resistive strip 300 results in the voltage level of each one of legs 302(a-n) with respect to voltage level Vss being a function of that leg's distance to edge 308. Thus, applying the voltage levels Vref and Vss to strip 300 results in a varying voltage level being generated along edge 304 and legs 302(a-n). Such voltage adjustment may affect the amplitude of the wave being generated.

At 504, a signal is provided by the control circuit 222 to set the frequency of the output analog sine wave. In one implementation, the input of control circuit 222 may connected, for example, to an external adjustable digital frequency generator, or a digital crystal clock. The frequency of sine wave may be set in relation to the frequency of the digital frequency generator.

At 506, the control circuit 222 then individually activates the switches 216(a-n) one at a time. In other words, switch 216n is activated while the other switches, e.g. switch 216(a-m), are deactivated. The switches 216(a-n) may then be activated sequentially along the long edge of strip. For example, switch 216n is activated, then switch 216m is activated, then switch 2161 is activated, and so forth. In one embodiment, the control circuit 222 includes a counter that counts up and then down to individually activate the switches 216(a-n). When the counter counts up, the voltages sequentially applied at legs 302(a-n) are passed to the output 224. When then counter counts down, the voltages sequentially applied at legs 302(n-a) are passed to the output 224 thereby generating a precise analog sine wave. The frequency of the wave may be adjusted by changing the rate at which the switches open and close.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

The invention claimed is:

1. A system comprising:
a circuit board having a power etching and a ground etching;
a semiconductor circuit disposed on the circuit board, the semiconductor circuit having a power terminal coupled with the power etching and a ground terminal coupled with the ground etching, the semiconductor circuit comprising:
 a trapezoid shaped resistive strip coupled with the power terminal and the ground terminal, the trapezoid shaped resistive strip having a plurality of contacts adapted to provide outputs at various voltage levels;
 a plurality of switches coupled with the contacts on the trapezoid shaped resistive strip and having a common output; and
 a control circuit for selectively enabling the switches to generate an analog wave at the common output.

2. A system as recited in claim 1, wherein the trapezoid shaped resistive strip is formed with a plurality of holes.

3. A system as recited in claim 1, wherein the trapezoid shaped resistive strip has a first edge and second edge, the second edge shorter than the first edge, and wherein the plurality of contacts are disposed on the resistive strip at equally spaced distance intervals along the first edge.

4. A system as recited in claim 3, wherein the control circuit enables switches in a sequential order that the switches are coupled with the contacts along the long edge.

5. A system as recited in claim 1, wherein the trapezoid shaped resistive strip has a long edge, a short edge shorter than the long edge, and two edges having substantially equal length disposed between the long edge and the short edge, and said short edge and long edge lying in the same plane at a right angle to one another.

6. A system as recited in claim 5, wherein one of the two edges is coupled with the power terminal and the other edge is coupled with the ground terminal.

7. A system as recited in claim 5 wherein a ratio of a length of an imaginary line extending from an intersection between the one of the equal length edges and the long edge to an intersection point of an imaginary line extending through the other of the equal length edges to the length of one of the equal length edges is substantially equal to the square root of pi.

8. A system as recited in claim 1, wherein the analog sine wave has a frequency, and wherein the frequency of the analog sine wave is adjustable by changing the rate at which the switches open and close.

9. A system as recited in claim 1, further comprising an adjustable power source to supply a voltage across the power terminal and the ground terminal, said adjustable power supply operative to adjust the voltage of the power terminal with respect to the ground terminal to change the amplitude of the sine wave.

10. In a semiconductor device having a power terminal for applying a Vref voltage level and a ground terminal for applying a Vss voltage level, the device comprising:
a trapezoid shaped resistive strip coupled with the power terminal and the ground terminal, the trapezoid shaped resistive strip having a plurality of legs coupled along one edge for providing outputs at increasing voltage levels from the Vss voltage level to the Vref voltage level at the legs along the edge;
a plurality of switches coupled with the contacts on the strip and having a common output; and
a control circuit for activating and deactivating selected switches such that a sine wave is generated at the common output.

11. A device as recited in claim 10, wherein the trapezoid shaped resistive strip is formed having a plurality of holes.

12. A device as recited in claim 10, wherein the trapezoid shaped resistive strip has a long edge, and wherein the plurality of legs are disposed on the resistive strip at regular distance intervals along the long edge.

13. A device as recited in claim 10, wherein the trapezoid shaped resistive strip has a long edge, a short edge, and two edges having equal length disposed between the long edge and the short edge.

14. A device as recited in claim 13, wherein one of the edges of the trapezoid shaped resistive strip with the equal length is coupled with the power terminal and the other edge with the equal length is coupled with the ground terminal.

15. The device as recited in claim 13, wherein a ratio of a height of the trapezoid shaped resistive strip to a length of one of the equal length edges is substantially equal to the square root of pi.

16. A method comprising:
coupling a trapezoid shaped resistive strip with a power terminal and a ground terminal;
attaching a plurality of legs along one edge of the trapezoid shaped resistive strip to provide outputs corresponding to various voltage levels; and
coupling a plurality of switches having a common output with the legs on the strip such that when a voltage is applied to the power and ground terminal the common output generates an analog sine wave.

17. A method as recited in claim 16, wherein the trapezoid shaped resistive strip is formed with a plurality of holes.

18. A method as recited in claim 16, wherein the trapezoid shaped resistive strip has a long edge, and wherein the plurality of legs are disposed on the resistive strip at equal distance intervals along the long edge.

19. A method as recited in claim 16, wherein the trapezoid shaped resistive strip has a long edge, a short edge, and two edges having equal length disposed between the long edge and the short edge.

20. A method for generating a sine wave with a trapezoid shaped resistive strip having a plurality of legs disposed along a first edge of the trapezoid shaped resistive strip, the legs being respectively coupled to a plurality of switches with a common output, the method comprising:

applying a voltage across two other edges of the trapezoid shaped resistive strip, the two other edges adjacent the first edge; and activating the plurality of switches such that a sine wave is generated at the common output.

21. A method as recited in claim 20 further comprising adjusting the voltage across the other edges to change the amplitude of the sine wave.

22. A method as recited in claim 20 further comprising changing the rate at which the switches open and close to adjust the frequency of the sine wave.

23. A method as recited in claim 20, further comprising activating the switches in a sequential order corresponding to the order in which the legs are arranged along the first edge.

* * * * *